United States Patent [19]

Burmer

[11] Patent Number: 5,338,393
[45] Date of Patent: * Aug. 16, 1994

[54] METHOD FOR THE LOCAL REMOVAL OF UV-TRANSPARENT INSULATION LAYERS ON A SEMICONDUCTOR SUBSTRATE

[75] Inventor: Christian Burmer, Rohrdorf, Fed. Rep. of Germany

[73] Assignee: Siemens Aktiengesellschaft, Munich, Fed. Rep. of Germany

[ * ] Notice: The portion of the term of this patent subsequent to Aug. 9, 2011 has been disclaimed.

[21] Appl. No.: 852,952

[22] Filed: Mar. 17, 1992

[30] Foreign Application Priority Data

Mar. 22, 1991 [DE] Fed. Rep. of Germany ....... 4109535

[51] Int. Cl.$^5$ ................. H01L 21/441; H01L 21/306; H01L 21/268
[52] U.S. Cl. ................. 156/643; 156/663; 437/173; 437/187; 437/238
[58] Field of Search ............ 148/DIG. 93, DIG. 135; 437/192, 187, 238, 173; 156/663, 643

[56] References Cited

U.S. PATENT DOCUMENTS

| | | | |
|---|---|---|---|
| 4,668,337 | 5/1987 | Sekine | 156/643 |
| 4,693,779 | 9/1987 | Okuhira et al. | 156/643 X |
| 4,868,068 | 9/1989 | Yamaguchi et al. | 437/192 X |
| 4,885,047 | 12/1989 | Urm et al. | 156/643 X |

OTHER PUBLICATIONS

SPIE vol. 459 Laser Assisted Deposition, Etching and Doping, (1984), "UV Laser-Induced Radical-Etching for Microelectronic Processing", by G. L. Loper et al, pp. 121–127.

Solid State Technology, Jun., 1985, "Laser-Induced Chemical Vapor Deposition", by Raj Solanki et al, pp. 220–227.

*Primary Examiner*—John S. Maples
*Attorney, Agent, or Firm*—Hill, Steadman & Simpson

[57] ABSTRACT

UV-transparent insulating layers, particularly silicon oxide, over conductive structures on a semiconductor substrate, for example an aluminum interconnect, are locally removed in order to expose interconnects for measuring and testing purposes, for repair, or for other uses. For this purpose, the semiconductor substrate is introduced into a vacuum chamber into which a gaseous, layer-forming compound, particularly a metal carbonyl, is admitted with a carrier gas, and the light of a pulsed UV laser is directed onto the location to be uncovered. No highly toxic or corrosive halogen compounds are required. After the removal of the insulating layer, a metal layer can be locally deposited immediately subsequently thereto on the exposed interconnect from the gaseous metal carbonyl with the same process. A good contact for measuring tips, for example, thus being enabled in a simple way.

9 Claims, 1 Drawing Sheet

METHOD FOR THE LOCAL REMOVAL OF UV-TRANSPARENT INSULATION LAYERS ON A SEMICONDUCTOR SUBSTRATE

RELATED APPLICATION

The present application is related to copending application Ser. No. 852,951, filed Mar. 17, 1992, of Christian Burmer, entitled "METHOD FOR CONTACTING CONDUCTIVE STRUCTURES IN VLSI CIRCUITS."

BACKGROUND OF THE INVENTION

The invention is directed to a method for the local removal of insulating layers on a semiconductor substrate in a vacuum chamber with the assistance of laser light.

It is frequently necessary in semiconductor technology to undertake microwork at a semiconductor substrate during the manufacture of integrated circuits on the semiconductor substrate. Included are the local removal of passivation or insulating layers in circuits metallized in single-layer or multi-layer fashion, with the object of making conductive structures such as, for example, interconnects or pads accessible for various purposes. For example, analyses or electrical measuring and testing are such purposes. Furthermore, the locally exposed interconnects can be electrically conductively connected to one another by metal deposition in order to be able to simply implement potential design modifications and to check their compatibility. Semiconductor modules can also be repaired in the same way.

When the insulating layer to be removed is composed of silicon nitride or of an organic material such as, for example, polyimide, then it can be locally removed with the assistance of a pulsed UV laser on the basis of what is referred to as ablation in that the laser beam is directed or focused onto the desired location. Such an ablation, however, is not possible given an insulating layer having a high UV transmission such as, for example, silicon oxide and other glass-like layers since the layer lying therebelow would be damaged by the intense UV radiation. A number of laser-induced etching processes are known for the local removal of silicon oxide layers and are described in the article by G. Loper and M. Tabat in SPIE Vol. 459, Laser Assisted Deposition Etching and Doping (1984), pages 121–127, incorporated herein. Such laser-induced etching processes are based on the defined generation of highly reactive radicals from halogen-carbon compounds with the assistance of pulsed UV lasers in a vacuum chamber, so that a chemical reaction of the silicon oxide with these radicals occurs upon formation of volatile silicon and oxygen compounds. The gaseous chlorine and fluorine compounds utilized, however, have high toxicity and have an extreme corrosive effect on many materials, so that a high technological expenditure is required. Mechanical parts situated in the vacuum chamber such as, for example, xyz-tables for exact positioning of the semiconductor substrate to be processed become unusable within a short time due to the corrosion.

SUMMARY OF THE INVENTION

It is therefore an object of the present invention to specify a method with which a designational, local removal of UV-transparent insulating layers on a semiconductor substrate for the above indicated purposes is enabled in a simple way and, in particular, without employing toxic or corrosive chemical compounds.

This object is achieved by providing a method for local removal of a UV-transparent insulating layer on a semiconductor substrate in a vacuum chamber by use of laser light wherein a gas mixture is admitted into the vacuum chamber. The gas mixture comprises a carrier gas and a gaseous, layer-forming compound. The layer-forming compound is preferably a gaseous metal carbonyl. The carrier gas is preferably argon.

The method of the invention is based on the employment of gaseous, layer-forming compounds instead of the toxic halogen-carbon compounds. Surprisingly, UV-transparent insulating layers can be removed in this way. Given employment of gaseous, layer-forming metal compounds such as, for example, metal carbonyls, a particular advantage of the method is that metallic contacts can be deposited onto the exposed, conductive structures immediately subsequently thereto without interrupting the vacuum and with the same or with an only slightly modified method.

DESCRIPTION OF THE PREFERRED EMBODIMENTS

Figure 1:
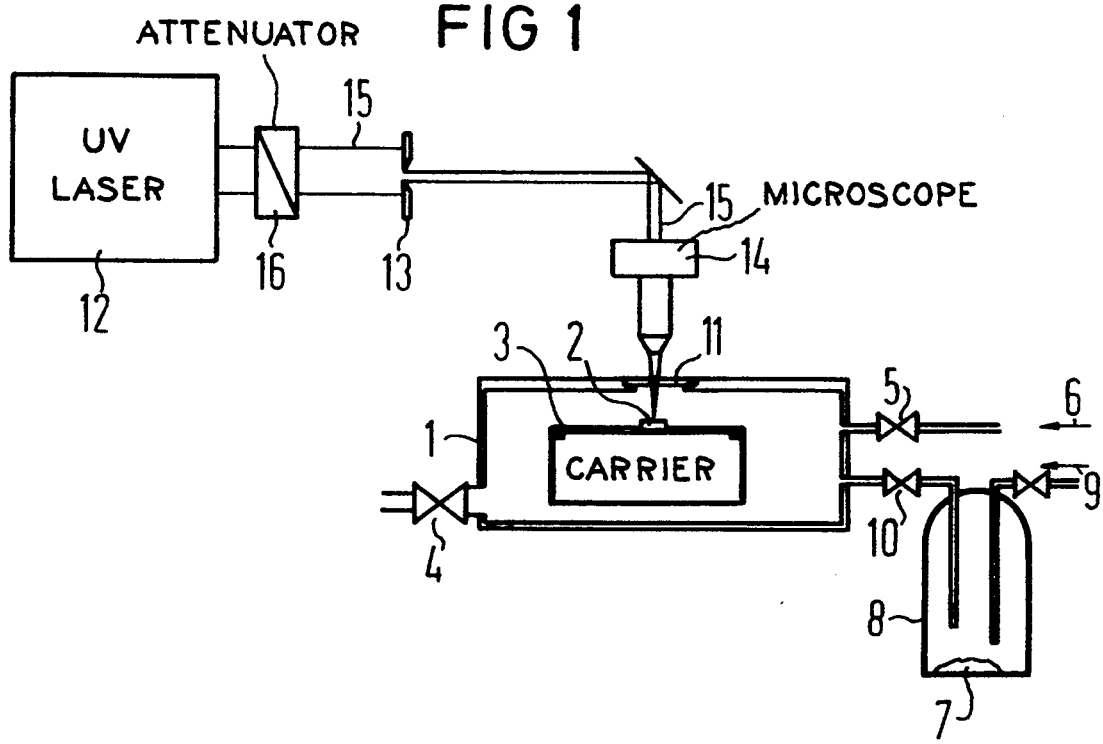
FIG. 1 shows an apparatus for the implementation of the method of the invention.

According to FIG. 1, a semiconductor substrate 2 having at least one UV-transparent insulating layer on its surface, or having an integrated circuit to be processed, is secured on a carrier 3 in a vacuum chamber 1, this carrier 3 enabling an exact positioning of the semiconductor substrate 2. Via a valve 4, the chamber 1 can be evacuated down to a pressure of approximately $10^{-6}$ mbar; an inert gas 6, for example argon, can be admitted via a further valve 5. The gaseous, layer-forming compound employed in the exemplary embodiments is tungsten hexacarbonyl $W(CO)_6$, a crystalline powder 7 at room temperature that is heated to approximately 50° C. in an evaporator vessel 8. The gas thereby arising by sublimation is admitted into the vacuum chamber 1 via a valve 10 with the assistance of an inert carrier gas 9, usually argon. Light pulses of a UV-laser 12 can be introduced into the chamber 1 through a silica glass window 11; an ArF excimer laser having a wavelength of 193 nm is preferably utilized. Every laser pulse passes through a conventional optical arrangement (not shown) usually composed of lenses and diaphragms in order to obtain a suitable, parallel laser beam 15 and thereby images a rectangular diaphragm 13 onto the surface of the semiconductor substrate 2 via a suitable microscope 14. The image of the diaphragm 13 defines the size of the irradiated substrate surface 2 and can be set according to the demands; typical values thereby lie in a range from 2 $\mu m \times 2$ $\mu m$ through 15 $\mu m \times 15$ $\mu m$. The energy of the laser pulses is regulated with the assistance of an attenuator 16. The irradiated specimen surface is either locally eroded or covered with a tungsten layer dependent on the $W(CO)_6$ pressure established in the chamber 1, on the energy of the laser pulses and on the substrate surface itself.

Example: silicon dioxide erosion

Figure 2:
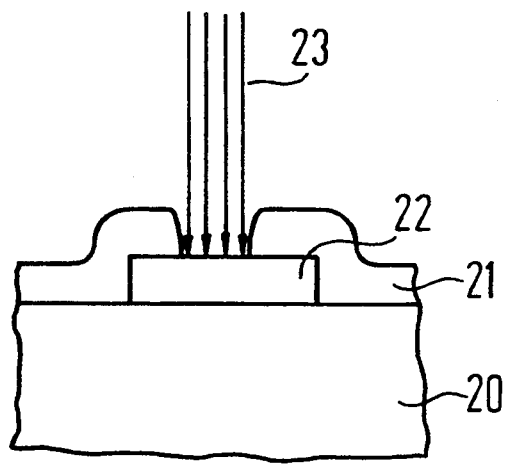
FIG. 2 shows a schematic illustration of a semiconductor substrate treated in accordance with the method.

FIG. 2 shows a 1 $\mu m$ thick silicon dioxide layer as a UV-transparent insulating layer 21 on the semiconductor substrate 20 having a conductive structure 22. When the following process parameters are set, it is eroded in approximately 2 minutes with the assistance of the laser beam 23:

$W(CO)_6$ pressure: 0.4 mbar
Laser pulse energy: 1.2 $\mu J$
Pulse frequency: 50 Hz
Laser wavelength: 193 nm
Irradiated Area: 12 $\mu m \times 12$ $\mu m$ A conductive structure lying under the silicon dioxide layer is not attacked by this process since the pulse energy of the laser is too weak.

Tungsten can be immediately subsequently deposited with the recited process on a conductive structure exposed by the erosion. As soon as the overlying silicon oxide layer is eroded, the exposed, conductive structure of, for example, aluminum is not attacked by the process; on the contrary, tungsten is deposited on its surface with a laser-induced process. The parameters can also be modified; for example, a higher $W(CO)_6$ pressure or a lower laser power can be advantageous.

Due to scattered rays of the laser, a slow tungsten deposition generally also occurs in the environment of the exposed Al structure, on the oxide surface. This can be advantageous since disturbing charging phenomena in some analysis methods are thereby reduced.

The erosion of the silicon oxide layer in conformity with the method of the invention is based on the following mechanism. First, a surface layer is deposited on the surface composed of silicon oxide on the basis of a photolytic decomposition of the gaseous, layer-forming compound in the vapor phase, i.e. a tungsten-containing layer in the exemplary embodiments. This leads to an increased absorption of the laser radiation and, thus, to a heating of the surface. When adequate energy can be absorbed after a plurality of laser pulses, typically 2 through 5, material, namely tungsten and silicon oxide, is eroded by the next laser pulse. A surface composed of silicon oxide is again present and the process begins anew until the entire silicon oxide has been eroded. A photolytic deposition of tungsten from tungsten carbonyl then occurs on the exposed, conductive structure, as known from the literature (see, for example, R. Solanki, in Solid State Technology, June, 1985, pages 220 through 227, incorporated herein).

Perceptively, only the UV-transparency of the insulating layer is of significance for the method of the invention, but not the chemical composition thereof, as in the case of known photolytic erosion processes. The method, for example, can therefore also be employed for combinations of UV-transparent insulating layers.

Further, other gaseous compounds can be utilized from which a photolytic deposition of radiation-absorbing layers is possible; compounds of this type are known, for example, from the aforementioned article by R. Solanki.

Although various minor changes and modifications might be proposed by those skilled in the art, it will be understood that I wish to include within the claims of the patent warranted hereon all such changes and modifications as reasonably come within my contribution to the art.

I claim as my invention:

1. A method for local removal of a UV-transparent insulating layer on a semiconductor substrate in a vacuum chamber by use of laser light, comprising the steps of:

admitting a gas mixture into the vacuum chamber, said gas mixture comprising a carrier gas and a gaseous, layer-forming compound; and irradiating a surface of the insulating layer with the laser light to first deposit a layer only on irradiated regions, said layer resulting in increased absorption of the laser light and heating which then causes removal of the deposited layer and at least a portion of the insulating layer at the irradiated regions only until a surface of the insulating layer is again exposed, at which time the layering and removal process repeats itself, if all of the insulating layer has not yet been removed.

2. A method according to claim 1 including the step of employing a pulsed ArF laser having a wavelength of approximately 193 nm for generating the laser light.

3. A method according to claim 1 including the step of irradiating said surface of the insulating layer with the laser light over an area in a range from 2 $\mu m \times 2$ $\mu m$ to 15 $\mu m \times 15$ $\mu m$.

4. A method for local removal of a UV-transparent insulating layer on a semiconductor substrate in a vacuum chamber by use of laser light, comprising the steps of:

admitting a gas mixture into the vacuum chamber, said gas mixture comprising a carrier gas and a gaseous, layer-forming compound;

irradiating the insulating layer with the laser light to locally remove the insulating layer; and using argon as said carrier gas, employing a gaseous metal carbonyl as said gaseous, layer-forming compound, and employing silicon oxide as said UV-transparent insulating layer.

5. A method according to claim 2 including selecting parameters within the following ranges:

pressure of the metal carbonyl: 0.1 through 5 mbar;
    energy of laser pulses of the laser light: 05 through 20 $\mu J$; and
    frequency of the laser pulses: 20 through 100 Hz.

6. A method according to claim 2 including the step of employing tungsten hexacarbonyl as said gaseous metal carbonyl.

7. A method for local removal of a UV-transparent insulating layer on a semiconductor substrate, comprising:

placing the UV-transparent insulating layer on the semiconductor substrate in a vacuum chamber;

admitting a gas mixture into the vacuum chamber, said gas mixture comprising an inert carrier gas and a gaseous, layer-forming compound; and irradiating the insulating layer at a location for the local removal thereof with a laser light to locally remove the insulating layer, said layer-forming compound being in a vapor phase which results in deposit of a layer on the insulating layer only at the irradiated location which causes an increased absorption of laser radiation and thus a heating of the surface where the local removal is then effected by removal of the deposited layer and at least a portion of the insulating layer until a surface of the insulating layer is again exposed at which time the layering and removal process repeats itself, if all of the insulating layer has not yet been removed.

8. A method according to claim 7 wherein a metal layer is deposited on a surface of the substrate after the local removal of the insulating layer.

9. A method according to claim 7 wherein the combination of the layer-forming compound in the vapor phase and the laser light creates a metal containing layer on the insulating layer.

* * * * *